United States Patent
Muhr

(10) Patent No.: US 11,555,948 B2
(45) Date of Patent: Jan. 17, 2023

(54) SYNTHETIC DIAMOND OPTICAL ELEMENTS

(71) Applicant: ELEMENT SIX TECHNOLOGIES LIMITED, Didcot (GB)

(72) Inventor: Alexander Clark Muhr, Santa Clara, CA (US)

(73) Assignee: Element Six Technologies Limited, Didcot (GB)

( * ) Notice: Subject to any disclaimer, the term of this patent is extended or adjusted under 35 U.S.C. 154(b) by 492 days.

(21) Appl. No.: 16/464,376

(22) PCT Filed: Dec. 12, 2017

(86) PCT No.: PCT/EP2017/082338
§ 371 (c)(1),
(2) Date: May 28, 2019

(87) PCT Pub. No.: WO2018/108868
PCT Pub. Date: Jun. 21, 2018

(65) Prior Publication Data
US 2021/0124092 A1  Apr. 29, 2021

Related U.S. Application Data

(60) Provisional application No. 62/434,189, filed on Dec. 14, 2016.

(30) Foreign Application Priority Data

Jan. 4, 2017  (GB) ..................................... 1700068

(51) Int. Cl.
*G02B 1/118*  (2015.01)
*C30B 29/04*  (2006.01)
(Continued)

(52) U.S. Cl.
CPC .............. *G02B 1/118* (2013.01); *C30B 29/04* (2013.01); *G02B 1/02* (2013.01); *H01S 3/005* (2013.01); *H01S 3/0064* (2013.01)

(58) Field of Classification Search
None
See application file for complete search history.

(56) References Cited

U.S. PATENT DOCUMENTS 5,774,253 A    6/1998  Clune
10,809,420 B2 * 10/2020  Muhr ..................... G02B 1/118
(Continued)

FOREIGN PATENT DOCUMENTS

| WO | 2014135544 A1 | 9/2014 |
| WO | 2014135547 A1 | 9/2014 |
| WO | 2015193156 A1 | 12/2015 |

OTHER PUBLICATIONS

Guina, M., et al., "High-power disk lasers based on dilute nitride heterostructures," New Journal of Physics, Dec. 1, 2009, p. 125019 (13 pages), vol. 11, No. 12, Institute of Physics Publishing, Bristol, GB.
(Continued)

*Primary Examiner* — Derek S. Chapel
(74) *Attorney, Agent, or Firm* — Kilpatrick Townsend & Stockton LLP

(57) ABSTRACT

An optical element comprising a window formed of synthetic diamond material and an optical surface pattern formed directly in a surface of the synthetic diamond material. The window of synthetic diamond material is in the form of a wedged diamond window with non-parallel major surfaces defining a wedge angle in a range (1) arcminute to 10° and the optical surface pattern is formed directly in one or both of the non-parallel major surfaces. There is also described a laser system comprising the optical element and a laser having a coherence length, wherein the coherence (Continued)

length of the laser is greater than twice a thickness of the wedged diamond window at its thickest point.

12 Claims, 2 Drawing Sheets

(51) Int. Cl.
   *G02B 1/02* (2006.01)
   *H01S 3/00* (2006.01)

(56) References Cited

U.S. PATENT DOCUMENTS

| | | |
|---|---|---|
| 2010/0078577 A1 | 4/2010 | Moriya et al. |
| 2011/0309265 A1 | 12/2011 | Babinec et al. |
| 2015/0001840 A1* | 1/2015 | Parker .................... G02B 1/118 283/85 |
| 2016/0115624 A1 | 4/2016 | Pels et al. |

OTHER PUBLICATIONS

Karlsson, M., et al., "Diamond micro-optics: microlenses and antireflection structured surfaces for the infrared spectral region," Optics Express, Mar. 10, 2003, pp. 502-507, vol. 11, No. 5, OSA Publishing, US.

Balmer, R. S., et al., "Chemical vapour deposition synthetic diamond; materials, technology and applications," Journal of Physics: Condensed Matter, Aug. 19, 2009, p. 364221 (23 pages), vol. 21, No. 36, Institute of Physics Publishing, Bristol, GB.

Hobbs, Douglas S., et al., "Design, Fabrication, and Measured Performance of Anti-Reflecting Surface Textures in Infrared Transmitting Materials," Proceedings of SPIE, Mar. 29, 2005, pp. 1-16, vol. 5786, No. 40, The International Society for Optical Engineering.

Hobbs, Douglas S., "Study of the Environmental and Optical Durability of AR Microstructures in Sapphire, ALON, and Diamond," Proceedings of SPIE, Apr. 15, 2009, pp. 1-12, vol. 7302, No. 20, The International Society for Optical Engineering.

United Kingdom Patent Application No. GB1700068.8, Combined Search and Examination Report dated Jun. 21, 2017, 9 pages.

International Patent Application No. PCT/EP2017/82338, International Search Report and Written Opinion dated Dec. 12, 2017, 15 pages.

United Kingdom Patent Application No. GB1720641.8, Combined Search and Examination Report dated Jun. 27, 2018, 9 pages.

Sussmann et al., "Laser damage testing of CVD-grown diamond windows," Diamond and Related Materials, 1994, pp. 1173-1177, vol. 3, Elsevier S.A.

Hausmann et al., "Fabrication of diamond nanowires for quantum information processing applications," Diamond & Related Materials, 2010, pp. 621-629, vol. 19, Elsevier B.V.

Burek et al., "Free-Standing Mechanical and Photonic Nanostructures in Single-Crystal Diamond," Nano Letters, Nov. 19, 2012, pp. 6084-6089, vol. 12, American Chemical Society.

* cited by examiner

SYNTHETIC DIAMOND OPTICAL ELEMENTS

FIELD OF INVENTION

The present invention relates to synthetic diamond optical elements. Certain embodiments relate to the provision of an alternative to synthetic diamond optical elements comprising thin film anti-reflective coatings. Particular embodiments relate to synthetic diamond optical elements having optical, thermal, and mechanical characteristics suitable for high power optical applications although synthetic diamond optical elements as described herein may be used in other applications where the provision of an antireflective coating is undesirable due to factors including mechanical robustness, chemical inertness, low absorbance, and high thermal conductivity. Certain further embodiments relate to the provision of lensing and birefringent synthetic diamond optical elements having these characteristics.

BACKGROUND OF INVENTION

Standard thin film anti-reflective coatings on synthetic diamond optical elements have excellent performance in terms of minimising reflection, but are limited in high power optical systems due to the ease with which they are damaged. Due to high absorbance and/or poor thermal conductivity the anti-reflective coating tends to be the weak point in any synthetic diamond window resulting in a synthetic diamond window with a low laser induced damage threshold (LIDT). Furthermore, even if the absorption level of a thin film anti-reflective coating is relatively low, the thin film can still fail in high power density optical applications. For example, for a 20 kW infrared laser system damage of thin film anti-reflective coatings is problematic and current thin film anti-reflective coating solutions are unlikely to be compatible with laser systems operating at 40 kW or more. Such high power laser systems are desirable for a number of applications including laser produced plasma (LPP) extreme ultraviolet (EUV) lithography systems to drive integrated circuit processing to smaller dimensions. Such extreme optical applications will require a synthetic diamond window capable of handling extreme power densities and this will require the combination of: (1) a synthetic diamond material with the required dimensions and desired bulk optical characteristics including low optical reflectance/absorption/scatter; and; (2) an anti-reflective surface finish capable of handling extreme power densities. Thin film anti-reflective coatings can also be problematic in terms of their mechanical integrity, e.g. if subjected to scratching or abrasion.

As an alternative to thin film anti-reflective coatings, it is known that anti-reflective surface patterns such as moth-eye structures can be formed directly in the surface of an optical window material in order to provide an anti-reflective surface finish without the requirement of a coating. While such anti-reflective surface patterns have been successfully fabricated in a range of optical window materials, the application of this technology to synthetic diamond windows has proved problematic. The anti-reflective performance of such surface finishes has been variable due to the difficulty in processing precisely defined surface patterns into diamond material because of the extreme hardness, low toughness, and chemical inertness of diamond materials. Surface processing of polycrystalline diamond materials is further complicated by the fact that they comprise diamond grains having different orientations and different processing rates. Furthermore, the processing methods required to form anti-reflective surface structures in diamond material have resulted in significant surface and sub-surface crystal damage being incorporated into the diamond material. This surface and sub-surface damage in the synthetic diamond window causes a number of inter-related detrimental effects including: (1) a reduction in the laser induced damage threshold of the synthetic diamond window; (2) a reduction in the power at which the synthetic diamond window can operate; and (3) a reduction in the optical performance of the synthetic diamond window as a result of beam aberrations caused by the surface and sub-surface damage. As such it would be desirable to develop a process which forms precisely defined anti-reflective surface structure into a synthetic diamond window without introducing surface and sub-surface crystal damage so as to achieve a synthetic diamond window which has a low absorbance, a low reflectance, a high laser induced damage threshold, and high optical performance with minimal beam aberrations on transmission through the synthetic diamond window. In addition, it would be desirable to provide a process which is low cost, compatible with existing materials processing, and scalable over large areas.

WO2014/135544 describes a process which forms precisely defined anti-reflective surface structure into a synthetic diamond window without introducing significant surface and sub-surface crystal damage so as to achieve a synthetic diamond window which has a low reflectance, a high laser induced damage threshold, and high optical performance with minimal beam aberrations on transmission through the synthetic diamond window.

WO2014/135547 describes a similar process for fabricating precisely defined flattened lens structures in the form of a zone plate, Fresnel lens, or aspherical lens formed directly in at least one surface of the synthetic diamond material.

WO2015/193156 describes a process for fabricating optimized optical surface structures directly into a synthetic diamond window. These structures include anti-reflective surface patterns formed directly in the surface of the synthetic diamond material and also birefringent optical elements such as quarter and half wave plates which are essential optical components in many applications and allow for the polarization of incident light to be manipulated.

SUMMARY OF INVENTION

All of the aforementioned publications are concerned with forming precisely defined optical surface structure directly into a synthetic diamond component without introducing significant surface and sub-surface crystal damage so as to achieve a synthetic diamond component which has a low optical absorbance, a low reflectance, a high laser induced damage threshold, and high optical performance with minimal beam aberrations on transmission of a light beam through the synthetic diamond component.

However, it has been found that in certain applications significant beam aberrations still occur using such synthetic diamond components. In particular, it has been found that in certain applications, such as certain laser produced plasma (LPP) extreme ultraviolet (EUV) lithography systems, interference rings distort a Gaussian laser beam shape into a ring-shaped laser beam profile making such a synthetic diamond window component unsuitable for this application in the form previously described in the prior art. A need has thus been identified to modify the prior art synthetic diamond window components to prevent parasitic interference modes which lead to such beam profile distortions in certain applications.

The cause of the problem has been traced to parasitic internal reflections within a surface patterned synthetic diamond component which occur when the distance a light wave travels within the component, front surface to back surface to front surface, is within a coherence length of the laser resulting in interference. Interference creates areas of relatively high and low reflectivity, depending on local thickness, which leads to a distorted beam, especially in reflection. This is particularly problematic in laser systems in which the coherence length of the laser is greater than twice the thickness of the synthetic diamond component.

The aforementioned problem has been solved by introducing a small wedge angle into the synthetic diamond component. According to a first aspect of the present invention there is provided an optical element comprising: a window formed of synthetic diamond material; and an optical surface pattern formed directly in a surface of the synthetic diamond material, wherein the window of synthetic diamond material is in the form of a wedged diamond window with non-parallel major surfaces defining a wedge angle in a range 1 arcminute to 10° and the optical surface pattern is formed directly in one or both of the non-parallel major surfaces. Optionally the wedge angle is in a range 1 arcminute to 5°, 1 arcminute to 60 arcminutes, 1 arcminute to 30 arcminutes, 2 arcminutes to 10 arcminutes, 3 arcminutes to 8 arcminutes, or most preferably 3 arcminutes to 6 arcminutes for certain applications. The wedge angle should be sufficiently large to reduce or eliminate detrimental effects of interference within the patterned synthetic diamond component while being sufficiently small such that fabrication of the optical surface pattern is not unduly affected. If the wedge angle is too large then this can also detrimentally effect mechanical, optical, and thermal performance and can also cause mounting and bonding issues when integrating the synthetic diamond component into a laser system.

Since the component is particularly suited to reduce interference in laser systems which have a relatively long coherence length, according to a second aspect of the present invention there is provided a laser system comprising: a laser having a coherence length; and an optical element according to the first aspect of the invention, wherein the coherence length of the laser is greater than twice a thickness of the wedged diamond window at its thickest point.

Embodiments of the present invention including further optional and preferred features are described in the detailed description.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

As described in the summary of invention section, one aspect of the present invention is concerned with the fabrication of an optical element comprising: a window formed of synthetic diamond material; and an optical surface pattern formed directly in a surface of the synthetic diamond material, wherein the window of synthetic diamond material is in the form of a wedged diamond window with non-parallel major surfaces defining a wedge angle in a range 1 arcminute to 10° and the optical surface pattern is formed directly in one or both of the non-parallel major surfaces.

Figure 1:
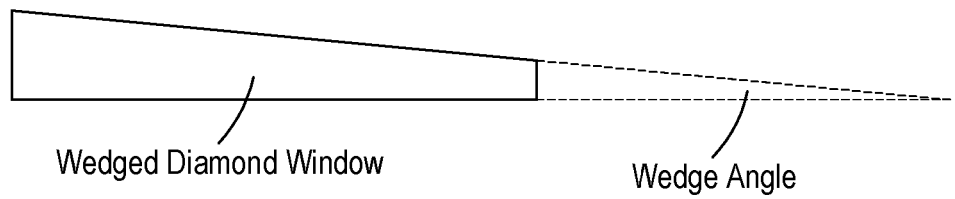
FIG. 1 is a schematic illustration of a wedged diamond window (the wedge angle has been increased for illustration purposes in the figure compared with the much smaller wedge angles used in embodiments of the present invention)

A schematic illustration of a wedged diamond window is shown in FIG. 1. It has been found that such a wedged and patterned synthetic diamond window is advantageous in certain laser applications to reduce or eliminate beam aberrations, particularly in systems which utilize a relatively long coherence length laser.

The wedged and patterned diamond window is fabricated by starting with a substantially parallel faced synthetic diamond window, lapping and/or polishing one or both surfaces at a controlled angle to introduce the desired wedge angle, and then patterning the diamond window on one or both major faces using a lithographic process as described herein to achieve the final product. Depending on the size of the wedge angle and the lithographic set-up, the lithography process may require the use of a shim to compensate for the wedge, i.e. to flatten the wedged surface for lithographic processing.

The wedge angle lies in a range 1 arcminute to 10°, 1 arcminute to 5°, 1 arcminute to 60 arcminutes, 1 arcminute to 30 arcminutes, 2 arcminutes to 10 arcminutes, 3 arcminutes to 8 arcminutes, or most preferably 3 arcminutes to 6 arcminutes for certain applications. As previously stated, the wedge angle should be sufficiently large to reduce or eliminate detrimental effects of interference within the patterned synthetic diamond component while being sufficiently small such that fabrication of the optical surface pattern is not unduly affected. If the wedge angle is too large then this can also detrimentally effect mechanical, optical, and thermal performance and can also cause mounting and bonding issues when integrating the synthetic diamond component into a laser system.

Typically, a difference in thickness between a thickest and a thinnest region of the wedged diamond window lies in a range 30 micrometers to 100 micrometers. The wedged diamond window also typically has a thickness at a central point which lies in a range 0.8 mm to 1.5 mm and a diameter which lies in a range 20 mm to 80 mm. Since the variation in thickness is small relative to other dimensions is can be difficult to visually detect. As such, a visually detectable marking can be provided on the wedged diamond window indicating a thickest point and/or a thinnest point of the wedged diamond window. Such a marking may be required to correctly align and mount the window for processing of the optical surface pattern and/or for correct alignment and mounting of the final diamond component in a laser system or sub-assembly.

For ease of mounting, the optical surface pattern on one or both sides of the wedge diamond window can be formed only in a central region of the wedged diamond window and is surrounded by an unpatterned border region for mounting the window. For example, the optical surface pattern(s) may have a diameter which lies in a range 30 mm to 70 mm. The unpatterned border region may have a diameter 5 to 20 mm larger.

The diamond material and the surface patterning can be selected and controlled to meet one or more of the following criteria:
 the wedged diamond window has a reflectivity of less than 0.1% at 10.6 micrometres;
 the or each optical pattern has an irregularity of less than 1 fringe at 633 nm;
 the wedge diamond window has a double pass transmitted wave front of less than 1 fringe at 633 nm; and
 the synthetic diamond material has a thermal conductivity greater than 2000 W/mK.

Figure 2:
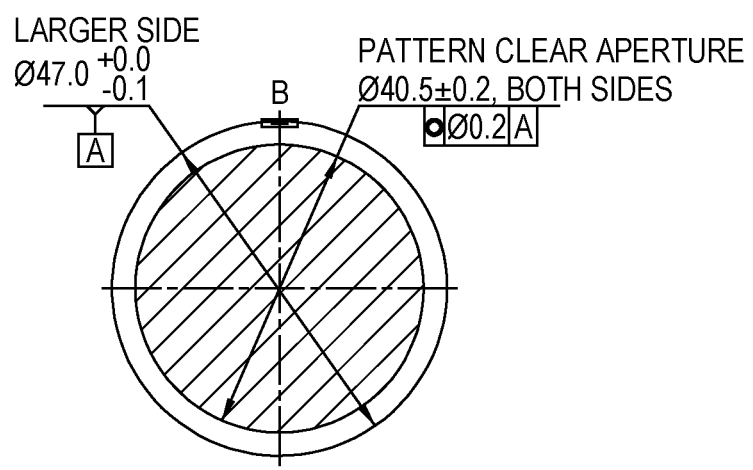
FIG. 2 shows a plan view of a wedged and patterned diamond window according to an embodiment of the present invention.
Figure 3:
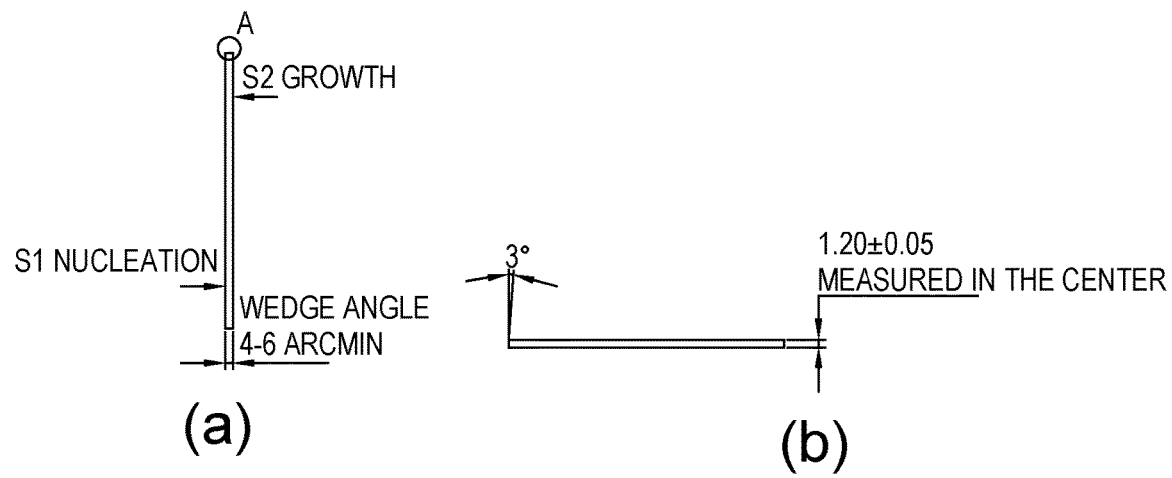
FIGS. 3(a) and 3(b) show cross-sectional views of the wedged and patterned diamond window.
Figure 4:
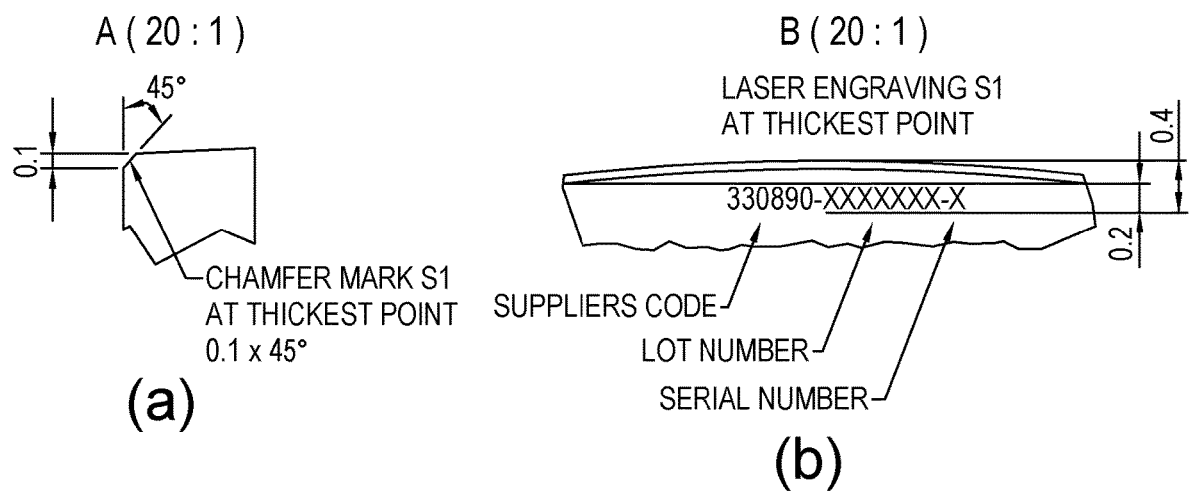
FIGS. 4(a) and 4(b) illustrate two methods of marking the wedged and patterned diamond window such that the thickest and/or thinnest part of the window can be visually identified.

An embodiment of a wedged and patterned diamond window according to the present invention is illustrated in FIGS. 2 to 4. Dimensions are given in units of millimetres.

FIG. 2 shows a plan view of the wedged and patterned diamond window which comprises a central patterned region surrounded by an unpatterned border region. The patterned region has a diameter of 40.5 mm (with a tolerance of ±0.2 mm) and the outer diameter of the border region is 47.0 mm (with a tolerance of +0.0 mm and −0.1 mm).

FIGS. 3(a) and 3(b) show cross-sectional views of the wedged and patterned diamond window. The polycrystalline diamond window has a nucleation face S1 (smaller diamond grains) and a growth face S2 (larger diamond grains), a wedge angle of 4 to 6 arcminutes, a side edge angle of 3°, and a thickness of 1.2±0.05 mm at a centre point of the window.

FIGS. 4(a) and 4(b) illustrate two methods of marking the wedged and patterned diamond window such that the thickest and/or thinnest part of the window can be visually identified. In FIG. 4(a) a chamfer mark is provided at a thickest point of the window whereas in FIG. 4(b) a laser engraved marking is provided at a thickest point of the window. In the illustration the marking also functions as a product code.

The illustrated embodiment has the following product specifications:
1. Material: CVD diamond, thermal conductivity >2000 W/mK.
2. Clear aperture (CA): 40.5±☐0.2 mm.
3. Wedge: 4-6 arcmin, thickness variation across part diameter=55-82 µm.
4. Optical performance:
 Power <1 fringe over CA @ 633 nm, both sides
 Irregularity <1 fringe over CA @ 633 nm, both sides
 TWF<1 fringe over CA, double pass @ 633 nm
 Full window reflectivity: 0.02%<r<0.09% @ 10.6 µm and @ 10.21 µm
  Angle of incidence: 0°
  Polarization: circular Such a wedged and patterned diamond window can be mounted in a laser system for applications such extreme ultraviolet lithography. Such a laser system comprises a laser having a coherence length and an optical element as described herein, wherein the coherence length of the laser is greater than twice a thickness of the wedged diamond window at its thickest point. The wedged and patterned diamond window is advantageous in such systems as the relatively long coherence laser beam is not unduly distorted by parasitic internal reflections.

Further details relating to the synthetic diamond component and optical surface patterning technology are similar to those set out in WO2014/135544, WO2014/135547, and WO2015/193156 and are set out below for completeness.

The present applicant has realized that developments in processing of high purity single crystal CVD diamond materials in the field of quantum sensing and quantum information processing can be transferred to the field of high power polycrystalline CVD diamond laser optics to achieve the fabrication of synthetic diamond optical elements which have low reflectance and high transmittance while also having low surface and sub-surface crystal damage thus exhibiting a high laser induced damage threshold.

Research into the use of high purity single crystal CVD diamond materials in the field of quantum sensing and quantum information processing is focussed on a particularly kind of point defect found within the diamond crystal lattice, namely the negatively changed nitrogen-vacancy defect ($NV^-$). The $NV^-$ defect has an electronic spin which can be manipulated to function as a quantum bit or alternatively as a quantum sensing element. The $NV^-$ defect can be optically excited, manipulated using microwaves, and emits fluorescent light which is characteristic of its electronic spin state.

One requirement for quantum sensing and quantum information processing applications is that the $NV^-$ electronic spin defect should have a long quantum coherence time and this requires the $NV^-$ electronic spin defect to be located in a highly pure diamond lattice environment which has a low concentration of crystal defects and low internal stress which can otherwise detrimentally reduce the quantum coherence time of the $NV^-$ electronic spin defects disposed within the diamond crystal lattice. Another requirement for quantum sensing and quantum information processing applications is that the fluorescent light emitted from the $NV^-$ electronic spin defects needs to be efficiently out-coupled from the diamond material to a suitable processor or detector configuration and in this regard it is desirable to fabricate nanowires, optical waveguide structures, and photonic cavity structures into the diamond material in order to effectively out-couple photons emitted from the $NV^-$ electronic spin defects. Inductively coupled plasma (ICP) etching has been used to fabricate such optical structures. However, it has been found that fabrication processes tend to introduce surface and sub-surface damage into the diamond crystal structure which adversely effects the quantum coherence time of the near-surface $NV^-$ electronic spin defects coupled to the optical surface structures. Furthermore, it has been found that the quality of the desired surface structures and the formation of unwanted etch grass between the desired surface structures is sensitive to the type of etch mask used and to the etch conditions. As such, work by groups developing structures for diamond quantum devices has focussed on refining the inductively coupled plasma (ICP) etching process in order to allow fabrication of optical out-coupling structures for near-surface $NV^-$ electronic spin defects without introducing significant quantities of surface and sub-surface damage into the diamond crystal structure while at the same time achieving well defined optical structures in the diamond surface without unwanted etch grass disposed between the structures. This work is described in a number of publications including: B. Hausmann et al, Fabrication of diamond nanowires for quantum information processing applications, Diamond and Related Materials 19, 621-629 (2010); M. Burek et al., Free-standing mechanical and photonic nanostructures in single crystal diamond, Nano Lett. 2012; and US2001/0309265.

Groups developing structures for diamond quantum devices have experimented with a variety of different combinations of gas flow rates, ICP powers, and pressures for fabricating optical out-coupling structures in single crystal CVD diamond material without introducing significant quantities of surface and sub-surface damage into the diamond crystal structure. For example, the following inductively coupled plasma reactive ion etching (ICP RIE) recipe is reported in the literature as being suitable for this purpose: an oxygen etchant which has an oxygen gas flow of between 30 to 50 sccm $O_2$, a chamber pressure of approximately 10 mTorr, and an ICP power of approximately 700 W. It is reported that this etch recipe allows the formation of very well defined surface structures while avoiding the formation of etch grass between the desired surface structures. In addition, it is reported that the shape and quantity of the etched optical structures in a diamond surface can be controlled by varying the ICP power during the etching process. For example, in the fabrication of nano-wires in the surface of single crystal CVD diamond material a multi-step ICP RIE process is reported including applying an ICP power of 700 W for two minutes, an ICP power of 600 W for three minutes, and an ICP power of 1000 W for five minutes. Further still, a number of different etch masks are reported in the diamond quantum device literature including $Al_2O_3$ particles, Au particles, $SiO_2$ particles, evaporated Au, and FOx e-beam resist.

In light of the above, it is evident that groups developing structures for diamond quantum devices based on defects in the diamond lattice have successfully developed an ICP RIE process which is capable of forming well defined surface structures in diamond material without forming unwanted etch grass between such structures and without introducing a large amount of surface and sub-surface crystal damage. This technology has been developed specifically for efficiently out-coupling fluorescent light emitted from the $NV^-$ electronic spin defects in quantum sensing and quantum information processing applications including the formation of nanowires, optical waveguide structures, and photonic cavity structures into the diamond material in order to effectively out-couple photons emitted from the $NV^-$ electronic spin defects.

The present applicant has realized that the requirements for out-coupling structures such as nanowires, optical waveguide structures, and photonic cavity structures in quantum sensing and quantum information processing applications are very similar to the requirements for the fabrication of better anti-reflective surface patterns in transmissive diamond windows suitable for high power laser applications. That is, the etching technology developed for quantum sensing and quantum information processing applications can be transferred into the field of transmissive optics to provide a synthetic diamond window for high power laser applications comprising an anti-reflective surface pattern, such as a moth-eye pattern, formed directly in the surface of the synthetic diamond window and which has low reflectance and high transmittance while also having low surface and sub-surface crystal damage thus exhibiting a high laser induced damage threshold. While the etching technology developed for quantum sensing and quantum information processing applications is utilized for etching nanowires, optical waveguide structures, and photonic cavity structures in single crystal CVD diamond material comprising fluorescent $NV^-$ defects, in accordance with embodiments of the present invention the etching technology is applied to low absorbance optical quality diamond material, such as high quality polycrystalline CVD diamond material, to fabricate low surface damage anti-reflective surface finishes, such as moth-eye structures, therein and thus produce optical elements having a combination of low absorbance, low reflectance, and a high laser induced damage threshold.

A method of fabricating an optical element is provided which comprises:
  forming a patterned resist layer on at least one surface of a synthetic diamond material;
  etching the at least one surface of the synthetic diamond material through the patterned resist layer; and
  removing the patterned resist layer to leave an anti-reflective surface pattern formed directly in the at least one surface of the synthetic diamond material,
  wherein the etching comprises, for example, an inductively coupled plasma reactive ion etching (ICP RIE) process comprising an oxygen gas flow rate of between 20 to 50 sccm $O_2$, a chamber pressure of between 5 and 20 mTorr, and an ICP power of between 600 and 1100 W.

Optionally, the inductively coupled plasma reactive ion etching process comprises one or more of: an oxygen flow rate between 25 and 35 sccm $O_2$; a chamber pressure between 7 and 15 mTorr; and an ICP power between 700 and 1000 W. The inductively coupled plasma reactive ion etching process may also comprise multiple steps with different ICP powers to control the surface profile of the anti-reflective surface pattern. Furthermore, the patterned resist layer may be formed from one of: $Al_2O_3$ particles; Au particles; $SiO_2$ particles; evaporated Au; and FOx e-beam resist. In practice, the resist is selected to be tolerant to a controlled deep etch. For example, a resist may be selected to be compatible with the formation of surface etch features having a height equal to or greater than 2 μm, 4 μm, 6 μm, 8 μm, or 10 μm.

Cyclic etching using different etch chemistries may also be utilized to control the etching and patterning process. For example, halogen based etches such as chlorine-argon plasma etches may also be used in addition to, for example, oxygen plasma etching as described above.

In addition to the above, it has been note that certain prior art approaches utilize a direct-write electron-beam lithography process for patterning of the resist prior to etching. This direct-write electron-beam lithography process can be somewhat time consuming and expensive. As such, according to one alternative option which may provide a faster and more cost effective route to patterning the resist layer, it is proposed that the patterned resist layer is formed using an interference lithography technique. Interference lithography techniques are already known in the art for forming moth eye antireflective structures in other materials. For example, Telaztec™ utilize this approach for fabricating moth eye antireflective structures in a range of materials. It is proposed here that such an interference lithography technique for patterning the resist may be combined with a low surface/sub-surface crystal damage etching technology as a route to providing a commercially viable way of fabricating diamond optical windows with low absorbance, low reflectance, and a high laser induced damage threshold for high power laser applications.

Applying the aforementioned methodology, it is possible to fabricate a synthetic diamond optical element having an anti-reflective surface pattern formed directly in at least one surface of the synthetic diamond material, wherein the optical element has a low absorption coefficient, a low reflectance, and a high laser induced damage threshold. However, as described in the summary of invention section, the ease with which such structures can be produced in an industrial manufacturing process in a consistent and reproducible manner has been found to be dependent on the geometry of the surface structures and the ability to accurately fabricate specific geometric patterns in diamond materials. In this regard, the present applicant has found that increasing the periodicity of moth-eye surface structures in diamond materials has a twofold benefit as described below.

The first benefit of increasing the periodicity of moth-eye surface structures in diamond materials is that the anti-reflective properties of the diamond surface become less sensitive to deviations from ideal structure geometry that occur within the plane of the surface. This has a significant effect in increasing the margin for error during the moth-eye fabrication process.

The second benefit of increasing the periodicity the periodicity of moth-eye surface structures in diamond materials is that the aspect ratio of the etched areas can be reduced for an ideal moth-eye surface. This is because the ideal etch depth is constant for any structure periodicity and because the ideal surface pattern's fill fraction changes only slightly with increased periodicity. Fill fraction is defined as (area of surface structure in one periodic unit)/(area of entire periodic unit). By allowing a decrease in the aspect ratio of the etched areas by increasing the periodicity of the surface structure, the ability to etch moth-eye structures without error in diamond materials is increased.

Although increasing structure periodicity reduces sensitivity to fabrication errors and increases the ability to fabricate the structures without error as described above, there is a limit to structure periodicity. At a certain periodicity, the moth-eye surface will begin to act as a diffraction grating and light will be lost from the zeroeth grating order to additional transmitted and reflected grating orders. The ideal structure periodicity is determined by the largest value at which additional, non-zeroeth, grating orders are suppressed.

In addition, it has also been found that the optical surface pattern should have a fill fraction within a defined range, the fill fraction defined as [area of projection in one periodic unit]/[area of the periodic unit]. This area based 2-dimension fill fraction parameter has been found to be important to functional performance and is distinct from a 1-dimensional fill factor parameter defined as [width of projection]/[length of periodic unit]. In this regard, it should be noted that the lithographic processing of diamond doesn't result in perfectly shaped projections and thus a 1-dimensional fill factor parameter cannot be readily converted into a 2-dimensional fill factor parameter.

In light of the above, there is provided an optical element comprising:
synthetic diamond material; and
an anti-reflective surface pattern formed directly in at least one surface of the synthetic diamond material,
wherein the anti-reflective surface pattern comprises a plurality of projections separated by trenches, the projections spaced apart with a periodicity d,
wherein the periodicity d is between 65 and 99% of a zeroeth order diffraction limit above which non zeroeth diffraction orders are observed at an operating wavelength $\lambda$
wherein the optical surface pattern has a fill fraction in a range 0.1 to 0.6, the fill fraction defined as [area of projection in one periodic unit]/[area of the periodic unit], and
wherein the optical element has an absorption coefficient measured at room temperature of $\leq 0.2$ cm$^{-1}$ at a wavelength of 10.6 µm.

The periodicity d is the spacing of projections in the anti-reflective surface pattern and can be determined by measuring the distance between the centres of adjacent projections (or more generally the distance from a point on one projection to a corresponding point on an adjacent projection). Usually, an ideal anti-reflective surface pattern will be one which is perfectly periodic such that the spacing between any two adjacent projections in the anti-reflective surface pattern is identical to any other two adjacent projections in the anti-reflective surface pattern. However, as will be appreciated from the present discussion, by ensuring that the periodicity d is between 65 and 99% of the zeroeth order diffraction limit, small deviations or variations in the anti-reflective surface pattern can be tolerated. An average periodicity over a number of projections can easily be determined by measuring the distance over a number of projections n and then dividing by (n−1). In this case, the average periodicity should be between 65 and 99% of the zeroeth order diffraction limit.

According to certain embodiments the periodicity d may be no less than 70%, 80%, 85%, or 87% of the zeroeth order diffraction limit and/or no more than 97%, 95%, or 92% of the zeroeth order diffraction limit and/or any combination of these upper and lower limits.

The operating wavelength $\lambda$ may be selected from one of: 10.6 µm; 2.2 µm; 1.06 µm; 633 nm; 532 nm; 355 nm; or 266 nm but is not limited to these wavelengths.

The zeroeth order diffraction limit for the periodicity d above which non zeroeth diffraction orders are observed at an operating wavelength $\lambda$ may be calculated as follows:

$$d_x < \lambda \Big/ \left\{ [\max(n_s^2, n_i^2) - (n_i \sin\theta \sin\phi)^2]^{\frac{1}{2}} + |n_i \sin\theta \cos\phi| \right\}$$

$$d_y < \lambda \Big/ \left\{ [\max(n_s^2, n_i^2) - (n_i \sin\theta \cos\phi)^2]^{\frac{1}{2}} + |n_i \sin\theta \sin\phi| \right\}$$

where $\theta$ and $\phi$ are the polar and azimuthal angles respectively and $n_s$ and $n_i$ are the refractive indices of the substrate and incident medium respectively. For an air-diamond interface $n_s=2.38$ and $n_i=1$. If the angle of incidence is assumed to be normal to the diamond surface then $\theta=\phi=0$ and these equations simplify to:

$d_x < \lambda/n_s$ $d_y < \lambda/n_s$

As described above, increasing the periodicity of the anti-reflective surface pattern allows a reduction in the depth-to-width aspect ratio of the trenches in the surface structure. For example, the trenches of the anti-reflective surface pattern may have a depth-to-width aspect ratio of less than 3, 2, or 1.5. Such relatively wide trenches are more readily fabricating into diamond materials in a more precise manner. However, it should be noted that the desired depth of the trenches remains constant at about 1.72 microns as structure periodicity is increased. Reduction in aspect ratio when increasing structure periodicity stems from increasing the width of the area etched. Aspect ratio of trenches is limited to a minimum of about 1.2 due to appearance of non-zero grating orders when further increasing structure periodicity.

The above values are for the depth-to-width aspect ratio in a moth-eye structure operating at 10.6 µm. However, in general this preferred aspect ratio will remain approximately constant as wavelength is either scaled up or down. Even though changing operating wavelength will affect the desired structure periodicity, desired fill fraction will remain fairly similar and desired etch depth will scale linearly. For example, if the operating wavelength is changed to 5.3 microns then etch depth would be scaled by ½ and etch width would be scaled by approximately ½, leaving aspect ratio approximately unchanged.

Anti-reflective surface patterns may comprise projections which have a variety of shapes including, for example, squares, rectangles, cylinders, holes, or hexagons. Sidewalls may also have some amount of taper. It has been found that the required aspect ratio of the trenches is also dependent upon the shape of the structures being etched. For example, it has been found that anti-reflective surface patterns comprising projections which have a square or rectangular cross-sectional shape are advantageous compared to cylinders. Periodic square structures maintain a constant separation (and therefore aspect ratio) along each face for a given fill fraction and periodicity. When considering cylindrical structures of the same fill fraction and periodicity, the minimum separation between cylinders will be significantly less than that of the constant separation of square structures. For this reason it is advantageous to etch square structures as opposed to cylinders. As an example, ideal square structures optimized for 10.6 µm with a periodicity of 4 µm will have a minimum aspect ratio of 1.27 while cylindrical structures of the same periodicity will have a minimum aspect ratio of 1.72.

Optionally, the diamond optical element may also have one or more of the following characteristics:
  an absorption coefficient measured at room temperature of $\leq 0.5$ cm$^{-1}$, $\leq 0.4$ cm$^{-1}$, $\leq 0.3$ cm$^{-1}$, $\leq 0.2$ cm$^{-1}$, $\leq 0.1$ cm$^{-1}$, $\leq 0.07$ cm$^{-1}$ or $\leq 0.05$ cm$^{-1}$ at a wavelength of 10.6 µm;
  a reflectance, at the surface comprising the antireflective surface pattern, of no more than 2%, 1.5%, 1%, or 0.5% at an operating wavelength of the optical element; and
  a laser induced damage threshold meeting one or both of the following characteristics: the laser induced damage threshold is at least 30 Jcm$^{-2}$, 50 Jcm$^{-2}$, 75 Jcm$^{-2}$, 100 Jcm$^{-2}$, 150 Jcm$^{-2}$, or 200 Jcm$^{-2}$ measured using a pulsed laser at a wavelength of 10.6 µm with a pulse duration of 100 ns and a pulse repetition frequency in a range 1 to 10 Hz; and
  the laser induced damage threshold is at least 1 MW/cm$^2$, 5 MW/cm$^2$, 10 MW/cm$^2$, 20 MW/cm$^2$, or 50 MW/cm$^2$ measured using a continuous wave laser at a wavelength of 10.6 µm.

Absorbance, reflectance, and laser induced damage threshold of an optical element are readily measurable by those skilled in the art (for example, ISO 21254-2:2011 describes methods for measuring laser induced damage threshold while Sussmann et al. [Diamond and Related Materials, 3, 1173-117, 1994] describe the specific application of laser damage testing to CVD diamond windows).

It should be noted that reflectance for an optical element will be dependent on the operating wavelength and that the anti-reflective surface pattern will be designed to be optimized for a particular operating wavelength. Where the operating wavelength for an optical element is unknown, then a range of wavelengths can be tested to determine where reflectance is minimized and this will correspond to the operating wavelength for the purposes of the present specification. That said, optionally the operating wavelength is selected from one of: 10.6 µm; 1.06 µm; 633 nm; 532 nm; 355 nm; 266 nm; or around 235 nm, with an operating wavelength of 10.6 µm being preferred for certain commercial applications.

A synthetic diamond optical element is provided which has low absorbance and low reflectance in combination with low surface damage and an increased laser induced damage threshold. This is considered to be a key combination of parameters for high power laser windows and other high power laser optics such as lenses and diffractive components.

Optionally, the diamond optical element may also have one or more of the following characteristics:
  a transmittance of at least 95%, 97%, 98% or 99% at the operating frequency of the optical element;
  a total integrated scatter in a forward hemisphere no more than 2%, 1%, 0.5%, or 0.1% at the operating frequency of the optical element;
  a dielectric loss coefficient tan δ measured at room temperature at 145 GHz of $\leq 2\times 10^{-4}$, $\leq 10^{-4}$, $\leq 5\times 10^{-5}$, $\leq 10^{-5}$, $\leq 5\times 10^{-6}$, or $\leq 10^{-6}$;
  an average microfeature density no greater than 5 mm$^{-2}$, 3 mm$^{-2}$, 1 mm$^{-2}$, 0.5 mm$^{-2}$, or 0.1 mm$^{-2}$;
  a microfeature distribution such that there are no more than 5, 4, 3, 2, or 1 microfeatures within any 3 mm$^2$ area;
  an integrated absorbance per unit thickness of no more than 0.20 cm$^{-2}$, 0.15 cm$^{-2}$, 0.10 cm$^{-2}$, or 0.05 cm$^{-2}$, when measured with a corrected linear background in a range 2760 cm$^{-2}$ to 3030 cm$^{-2}$;
  a thermal conductivity of no less than 1800 Wm$^{-1}$K$^{-1}$, 1900 Wm$^{-1}$K$^{-1}$, 2000 Wm$^{-1}$K$^{-1}$, 2100 Wm$^{-1}$K$^{-1}$, or 2200 Wm$^{-1}$K$^{-1}$;
  a silicon concentration as measured by secondary ion mass spectrometry of no more than $10^{17}$ cm$^{-3}$, $5\times 10^{16}$ cm$^{-3}$, $10^{16}$ cm$^{-3}$, $5\times 10^{15}$ cm$^{-3}$, or $10^{15}$ cm$^{-3}$;
  a nitrogen concentration as measured by secondary ion mass spectrometry of no more than $10^{18}$ cm$^{-3}$, $5\times 10^{17}$ cm$^{-3}$, $5\times 10^{16}$ cm$^{-3}$, $10^{16}$ cm$^{-3}$, $5\times 10^{15}$ cm$^{-3}$, or $10^{15}$ cm$^{-3}$; and
  an oxygen terminated surface.

Such optical characteristics can be achieved by applying the patterning technology as described herein to high quality optical grades of synthetic diamond material, such as high quality optical grade polycrystalline CVD diamond available from Element Six Limited. It is also envisaged that the patterning technology may be applied to optical grade single crystal CVD diamond (also available from Element Six Limited) for certain optical applications. Furthermore, in addition to polycrystalline diamond material and single crystal diamond material, the patterning technique as described herein may also be applied to tiled single crystal diamond plates in which a plurality of single crystal diamond substrates are inter-grown to form a single optical plate comprising a plurality of single crystal diamond windows or an effectively single crystal large area diamond plate. The patterning technique may also be applied to hetero-epitaxially grown single crystal diamond material.

Advantageously, the optical element meets one or more of the optical characteristics as described herein over at least 50%, 60%, 70%, 80%, 90%, or 100% of the area of the surface of the diamond optical element on which the anti-reflective diffractive surface finish is formed. In this regard, diamond optical elements can be fabricated to relatively large areas. For example, synthetic diamond components can be fabricated to a have largest linear dimension of at least 5 mm, 10 mm, 20 mm, 40 mm, 60 mm, 80 mm, 100 mm, 120 mm, or 140 mm. Such synthetic diamond components may be fabricated with a thickness equal to or greater than 200 µm, 250 µm, 350 µm, 450 µm, 500 µm, 750 µm, 1000 µm, 1500 µm, or 2000 µm.

Advantageously, the synthetic diamond material is fabricated by growing to a target thickness greater than that required for the final optical element and then processing a nucleation face of the diamond material to remove early stage nucleation diamond. As indicated in the background section, one weakness of prior art approaches is that early stage nucleation diamond is incorporated into the final optical element leading to a reduction in thermal conductance and an increase in optical absorbance. By growing the synthetic diamond material to a target thickness greater than that required for the final optical element it is possible to remove early stage nucleation diamond and thus provide an optical element with higher thermal conductance and lower optical absorbance. Removal of early stage nucleation diamond will inevitably result in a slight reduction in the strength of the synthetic diamond material. However, manufacturers such as Element Six Limited are capable of fabricating thick wafers of synthetic diamond material, such as polycrystalline CVD diamond wafers, with a high tensile rupture strength which enables removal of early stage nucleation diamond while retaining sufficient mechanical strength for end applications. For example, the synthetic diamond material may have one or more of the following structural characteristics:

- a tensile rupture strength with a nucleation face of the synthetic diamond material in tension of: ≥760 MPa×n for a thickness of 200 to 500 μm; ≥700 MPa×n for a thickness of 500 to 750 μm; ≥650 MPa×n for a thickness of 750 to 1000 μm; ≥600 MPa×n for a thickness of 1000 to 1250 μm; ≥550 MPa×n for a thickness of 1250 to 1500 μm; ≥500 MPa×n for a thickness of 1500 to 1750 μm; ≥450 MPa×n for a thickness of 1750 to 2000 μm; or ≥400 MPa×n for a thickness of ≥2000 μm, wherein multiplying factor n is 1.0, 1.1, 1.2, 1.4, 1.6, 1.8, or 2; and
- a tensile rupture strength with a growth face of the synthetic diamond material in tension of: ≥330 MPa×n for a thickness of 200 to 500 μm; ≥300 MPa×n for a thickness of 500 to 750 μm; ≥275 MPa×n for a thickness of 750 to 1000 μm; ≥250 MPa×n for a thickness of 1000 to 1250 μm; ≥225 MPa×n for a thickness of 1250 to 1500 μm; ≥200 MPa×n for a thickness of 1500 to 1750 μm; ≥175 MPa×n for a thickness of 1750 to 2000 μm; or ≥150 MPa×n for a thickness of ≥2000 μm, wherein multiplying factor n is 1.0 1.1, 1.2, 1.4, 1.6, 1.8, or 2.

Such synthetic diamond material may be processed to a surface flatness ≤5 μm, ≤4 μm, ≤3 μm, ≤2 μm, ≤1 μm, ≤0.5 μm, ≤0.2 μm, ≤ or 0.1 μm and/or a surface roughness $R_a$ no more than 200 nm, 150 nm, 100 nm, 80 nm, 60 nm, 40 nm, 20 nm, or 10 nm. In this regard, it may be noted that the $R_a$ limit is in part determined by operating wavelength. The aforementioned limits apply for mid and far IR operating wavelengths. For visible operating wavelengths, the $R_a$ limit will typically be lower. In this regard, it will be noted that for single crystal diamond materials an $R_a$ much lower than 10 nm is achievable.

Further improvements to the thermal conductivity of the synthetic diamond material can be made by reducing the natural 1.1% $^{13}C$ content of the material. As such, the synthetic diamond material may comprise at least a portion which has a $^{13}C$ content of less than 1.0%, 0.8%, 0.6%, 0.4%, 0.2%, 0.1%, 0.05%, or 0.01%. In this regard, it should be noted that isotopically purified carbon source gas is expensive. As such, rather than fabricate the entire optical element from isotopically purified diamond material it can be advantageous to only fabricate a portion of the optical element from isotopically purified diamond material. For example, one or more surface layers of the synthetic diamond material may be formed of isotopically purified diamond material with the interior bulk being fabricated using a higher $^{13}C$ content, preferable natural abundance. In one particularly useful embodiment a surface layer comprising the anti-reflective surface pattern is formed of isotopically purified diamond material so as to increase the thermal conductivity of the anti-reflective surface pattern and thus reduce localized heating and increase the laser induced damage threshold of the anti-reflective surface pattern. An underlying portion of synthetic diamond material may then comprise a higher concentration of $^{13}C$, preferably natural abundance, to reduce synthesis costs.

The anti-reflective surface finish of the present invention may be formed over the majority of a surface of the synthetic diamond material, e.g. over at least 50%, 60%, 70%, 80%, 90%, or over the entire surface. As such, the anti-reflective diffractive surface finish can be formed over an area of at least 25 mm², 50 mm², 100 mm², 200 mm², 300 mm², 500 mm², 700 mm², 1000 mm², 1500 mm², 2000 mm², 3000 mm², 5000 mm², 7000 mm², 10000 mm², 15000 mm², or 20000 mm².

The surface which is patterned with the anti-reflective surface finish may, for example, form the major optical exit and/or entry face of a diamond window with a majority, or the entire, optical exit and/or entry face of the optical element being patterned with an anti-reflective diffractive surface finish. In some applications it may be desirable to leave an unpatterned portion around a peripheral region of the transmissive optical element for mounting the transmissive optical element. Optionally, the anti-reflective surface pattern is formed on at least two surfaces of the synthetic diamond material. For example, the anti-reflective diffractive surface finish can be formed on both the optical entry face and the optical exit face of the optical element, e.g. on opposing major faces of a diamond window. Alternatively, for certain optical elements low reflectance is only required on one surface of the optical element, e.g. a beam splitter where partial reflectance is required on one surface.

The present invention has been described above in the context of providing a synthetic diamond optical element comprising an anti-reflective surface pattern formed directly in the surface of synthetic diamond material. However, as described in the background section of this specification, for certain applications it is required to provide a birefringent optical element and similar problems arise. As such, other embodiments of the present invention provide a synthetic diamond optical element comprising a birefringent surface pattern formed directly in the surface of the synthetic diamond material and which has low surface and sub-surface crystal damage thus exhibiting a high laser induced damage threshold. Such birefringent surface patterns can be formed directly in the surface of synthetic diamond material using the fabrication techniques as described herein. The major difference between an antireflective surface pattern and a birefringent surface pattern is that a birefringent surface pattern comprises elongate projections which are used for manipulation of polarization. That said, while their end uses can be quite different, antireflective surface patterns and birefringent surface patterns as described herein follow the same design guidelines in terms of periodicity. It may also be noted that birefringent gratings will also reduce reflections at the surface in which they are disposed, but the reflections will not be reduced to the degree they would be for an optimized antireflective surface pattern. For example, reflection at a birefringent surface pattern will be around 7 or 8% depending on the exact design of the birefringent pattern. Thus, according to certain configurations, an optical element may be provided with a birefringent surface pattern formed in one surface of the synthetic diamond material and an antireflective surface pattern formed in another surface of the synthetic diamond material.

Birefringent subwavelength gratings can be formed in the surface of synthetic diamond with the necessary etch depth to create either a quarter or half waveplate. This approach has a number of advantages over traditional waveplates. For one, synthetic diamond possesses a very high laser induced damage threshold and is an excellent conductor of heat at room temperatures. This means that a waveplate grating fabricated in diamond can be used in the most demanding high power laser applications without being damaged and without suffering detrimental thermal effects typical of other materials.

A subwavelength grating is a grating where feature periodicity is below the limit where nonzeroth diffraction orders appear. For a plane wave at normal incidence this limit is given by $P<\lambda/\max(n_s, n_i)$ where P=periodicity, $\lambda$=wavelength, $n_s$=refractive index of substrate, and $n_i$=refractive index of incident medium. Because most real world applications involve Gaussian beams and not true plane waves it is best to design a subwavelength grating below 90% of the aforementioned limit i.e. $P<0.9*\lambda/\max(n_s, n_i)$. Because the feature size of a subwavelength grating is small relative to the wavelength of incident light, the grating acts as though it were a uniform medium with a refractive index somewhere between that of the substrate and incident medium.

To make a birefringent subwavelength grating simply requires features with asymmetric dimensions along the x and y axes. The simplest design for a birefringent subwavelength grating is a linear grating where the periodicity of the lines is below the subwavelength limit. Alternatively, other simple designs include structures that are rectangular (but not square) or elliptical. These structures can be etched into the surface of diamond using processing techniques as described herein.

When light interacts with a subwavelength grating the grating is treated as though it were a uniform material with a certain refractive index. The grating can essentially be considered a thin film with an effective refractive index between that of the incident medium and that of the substrate. When the subwavelength grating structures are asymmetric between the x and y axes, the effective index of the grating also becomes asymmetric between the x and y axes. In other words, the asymmetric grating is treated as a birefringent medium with a "fast" and a "slow" axis. By controlling the depth of the birefringent subwavelength grating it is possible to design a grating with a set amount of retardance between polarization states along the fast vs slow axes. By designing the retardance to be either a quarter or half wave makes the grating an effective quarter or half waveplate.

Advantages of a birefringent subwavelength grating in diamond over a traditional waveplate include: greater laser induced damage threshold; higher thermal conductivity material; size limited only by available size of diamond windows; and provision of a true zero-order waveplate.

Optical elements fabricated from high quality optical grade synthetic diamond material and comprising an optical surface pattern as described herein are suitable for use in high power optical systems due to their low reflectance and high laser induced damage threshold. As such, there is provided an optical system comprising:

a synthetic diamond optical element comprising an optical surface pattern as described herein; and a light source (e.g. a laser) configured to generate light at a power of at least 300 W, 500 W, 1 kW, 3 kW, 5 kW, 10 kW, 15 kW, 20 kW, 25 kW, 30 kW, 35 kW, 40 kW, 45 kW, or 50 kW and transmit said light through the synthetic diamond optical element.

In relation to the above, it will be noted that the operating power of the described optical system is significantly lower that the previously defined continuous wave laser induced damage threshold of 1 MW/cm$^2$. However, it should be noted that to provide an optical element that has a long operating lifetime the laser induced damage threshold of the synthetic diamond optical element should be significantly higher than the operating power of the optical system.

Laser induced damage threshold (LIDT) is one of the key motivations for embodiments of this invention and is measured in terms of power density. In this regard, it may be noted that high power density does not necessarily mean high operating power although high operating power typically goes with high power density. Current systems are now operating at a power density between 1 and 10 kW/cm$^2$ with further increases towards 100 kW/cm$^2$ anticipated. If we assume a laser with 20 kW CW power, a 1/e$^2$ beam size of 20 mm, 40 mm, or 60 mm, and that the beam is Gaussian (power density at center of window ~2× average power density), then we get CW power densities of 12.7 kW/cm$^2$, 3.2 kW/cm$^2$, and 1.4 kW/cm$^2$ at the center of the synthetic diamond optical window respectively. Peak power densities will then be significantly higher depending on pulse length and repetition rate. Accordingly to embodiments of the optical system, the light source (e.g. a laser) may thus be configured to generate light at a power density of at least 1 kW/cm$^2$, 3 kW/cm$^2$, 5 kW/cm$^2$, 10 kW/cm$^2$, 20 kW/cm$^2$, or 50 kW/cm$^2$, and transmit said light through the synthetic diamond optical element.

Optionally, the optical system may also provide a cooling system for cooling the synthetic diamond optical element. In this regard, the present inventors have noted that Element Six's optical grade synthetic diamond material shows a large decrease in absorption at low temperatures. This effect is not seen to the same extent with certain other diamond materials.

While this invention has been particularly shown and described with reference to embodiments, it will be understood to those skilled in the art that various changes in form and detail may be made without departing from the scope of the invention as defined by the appending claims.

The invention claimed is:

1. An optical element comprising:
   a window formed of synthetic diamond material; and
   an optical surface pattern formed directly in a surface of the synthetic diamond material, the optical surface pattern comprising a plurality of projections separated by trenches, the projections spaced apart with a periodicity d, wherein the periodicity d is between 65 and 99% of a zeroeth order diffraction limit above which non zeroeth diffraction orders are observed at an operating wavelength $\lambda$, and wherein the optical surface pattern has a fill fraction in a range 0.1 to 0.6, the fill fraction defined as [area of projection in one periodic unit]/[area of the periodic unit];
   wherein the window of synthetic diamond material is in the form of a wedged diamond window with non-parallel major surfaces defining a wedge angle in a range 1 arcminute to 60 arcminutes and the optical surface pattern is formed directly in one or both of the non-parallel major surfaces.

2. An optical element according to claim 1, wherein a difference in thickness between a thickest and a thinnest region of the wedged diamond window lies in a range 30 micrometers to 100 micrometers.

3. An optical element according to claim 1, wherein a marking is provided on the wedged diamond window indicating a thickest point and/or a thinnest point of the wedged diamond window.

4. An optical element according to claim 1, wherein the wedged diamond window has a thickness at a central point which lies in a range 0.8 mm to 1.5 mm.

5. An optical element according to claim 1, wherein the wedged diamond window has a diameter which lies in a range 20 mm to 80 mm.

6. An optical element according to claim 1, wherein the optical surface pattern is formed in a central region of the wedged diamond window and is surrounded by an unpatterned border region for mounting the window.

7. An optical element according to claim 1, wherein the optical surface pattern has a diameter which lies in a range 30 mm to 70 mm.

8. An optical element according to claim 1, wherein the wedged diamond window has a reflectivity of less than 0.1% at 10.6 micrometres.

9. An optical element according to claim 1, wherein the optical pattern has an irregularity of less than 1 fringe at 633 nm.

10. An optical element according to claim 1, wherein the wedge diamond window has a double pass transmitted wave front of less than 1 fringe at 633 nm.

11. An optical element according to claim 1, wherein the synthetic diamond material has a thermal conductivity greater than 2000 W/mK.

12. A laser system comprising:
a laser having a coherence length; and
an optical element according to any claim 1, wherein the coherence length of the laser is greater than twice a thickness of the wedged diamond window at its thickest point.

\* \* \* \* \*